United States Patent [19]

Loeppert et al.

[11] Patent Number: 5,446,413

[45] Date of Patent: Aug. 29, 1995

[54] IMPEDANCE CIRCUIT FOR A MINIATURE HEARING AID

[75] Inventors: Peter V. Loeppert, Hoffman Estates; Steven E. Boor, Lombard, both of Ill.

[73] Assignee: Knowles Electronics, Inc., Rolling Meadows, Ill.

[21] Appl. No.: 247,136

[22] Filed: May 20, 1994

[51] Int. Cl.6 .............................................. H03F 3/185
[52] U.S. Cl. ................................... 330/277; 330/296; 381/691
[58] Field of Search .................... 330/207 P, 277, 296, 330/298; 381/69.1, 120, 121

[56] References Cited

U.S. PATENT DOCUMENTS

| | | | |
|---|---|---|---|
| 3,448,397 | 6/1969 | Lin et al. | 330/277 |
| 3,601,625 | 8/1971 | Redwine et al. | 330/298 X |
| 4,068,090 | 1/1978 | Komatsu et al. | 330/277 X |
| 4,764,690 | 8/1988 | Murphy et al. | |
| 4,896,121 | 1/1990 | Larson | 330/277 X |
| 5,192,920 | 3/1993 | Nelson et al. | 330/277 |

OTHER PUBLICATIONS

A. G. H. Van Der Donk, J. A. Voorthuyzen, and P. Bergveld; "General Considerations of Noise in Microphone Preamplifiers," Mar., 1991, Journal: Sensors and Actuators, vol. A26, Nos. 1-3, pp. 515-520.

Armand G. H. van der Donk, Piet Bergveld and Johannes A. Voorthuyzen; "Optimal Design of an Electret Microphone Metal-Oxide-Semiconductor Field-Effect Transistor Preamplifier," Apr., 1992, Acoustical Society of America, pp. 2261-2269.

Primary Examiner—James B. Mullins
Attorney, Agent, or Firm—Wallenstein & Wagner, Ltd.

[57] ABSTRACT

An impedance matching, reducing, or buffering circuit for permitting smooth signal flow from a first transmission medium to a second transmission medium. The circuit provides a first node adapted for coupling to the first transmission medium and for receiving a signal from the first transmission medium. The circuit further provides a buried channel transistor, that is coupled to the first node and that is biased by additional circuit devices, for transforming the impedance imposed on the signal. The use of the buried mode transistor reduces noise on the surface of the transistor while at the same time keeps other performance standards high. The circuit additionally provides a second node that is coupled to the buried channel transistor and that is adapted for coupling to the second transmission medium for conveying the signal to the second transmission medium.

16 Claims, 1 Drawing Sheet

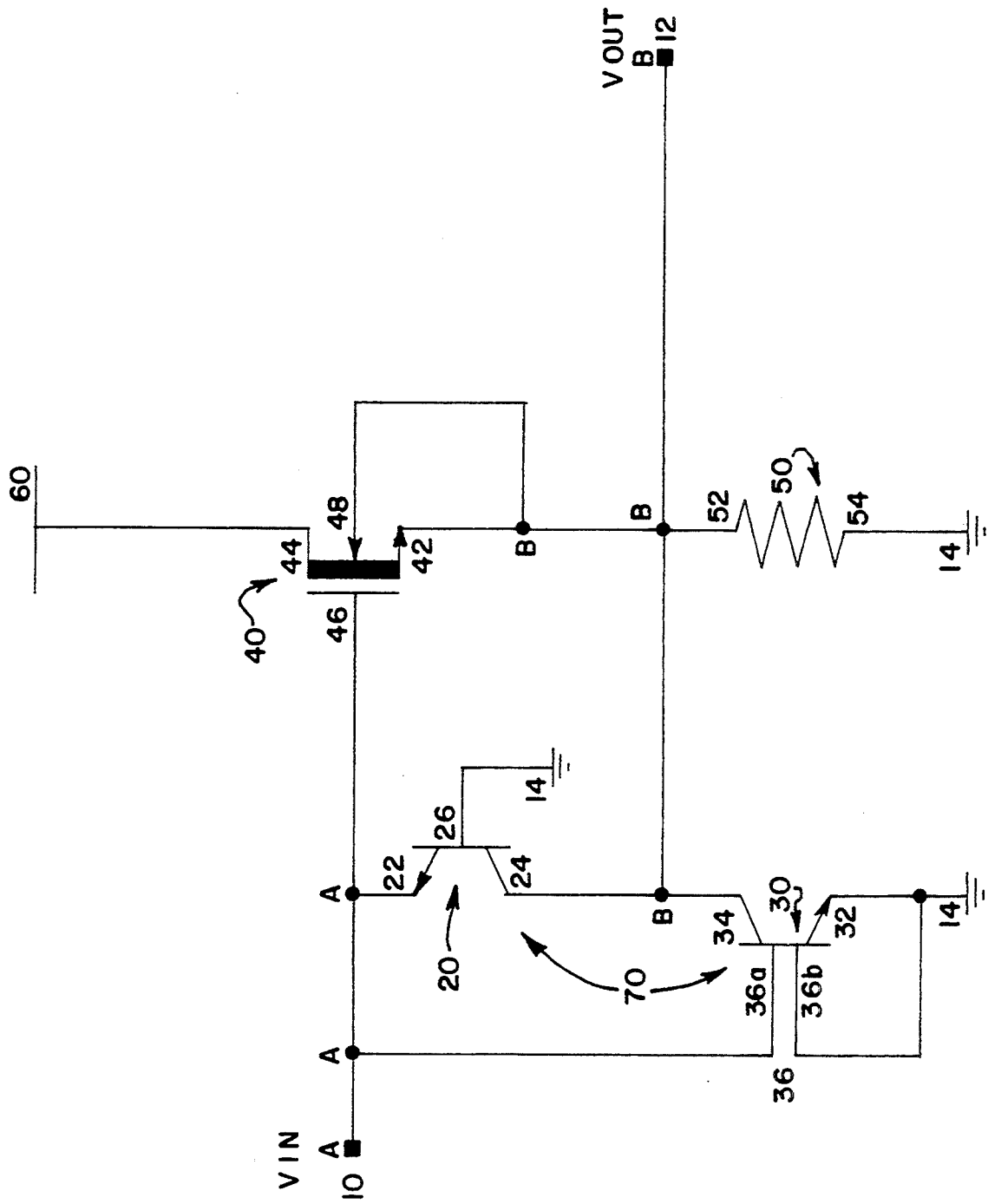

IMPEDANCE CIRCUIT FOR A MINIATURE HEARING AID

TECHNICAL FIELD

The present invention relates generally to impedance reduction and/or impedance buffering within electrical circuits. More particularly, this invention relates to impedance reduction and/or buffering circuits for use within miniature hearing aid devices that are designed for high performance, low noise, and reduced size.

BACKGROUND PRIOR ART

The general construction of hearing aids usually includes a microphone portion, an amplification portion, and a receiver portion. The microphone portion picks up sound waves in audible frequencies and creates an electronic signal representative of these sound waves. The amplification portion takes the electronic signal and amplifies the signal, and then sends the amplified signal to the receiver portion. The receiver portion produces enhanced original sound waves that are easier to hear than the original sound waves. Thus, a hearing aid user benefits from the enhanced sound waves.

Although hearing aid users benefit from the increased ability to hear sounds that surround them, prior art hearing aids were problematic in that they were fairly large. In particular, when a hearing aid was worn by a user, either in front or behind the ear, the hearing aid was visible by an observer. Furthermore, even when the hearing aid was recessed and a tube extended from the hearing aid into a user's ear, the tube was still visible by an observer. Thus, a hearing aid user often would not want to wear a hearing aid at all, when the hearing aid or tube extending into the user's ear was visible by an observer.

Thus, there has been a goal in the industry to create a smaller and smaller hearing aid which would fit into an ear canal, yet perform at the same or higher levels of performance than the larger hearing aid devices. Smaller hearing aids require smaller transducers which, in the case of microphones, means less source capacitance. As a result, the front ends of the amplifier portion 3, must have very high resistances and very low input capacitances in order to match or buffer to the source impedance. It is well known that Metal Oxide Semiconductor Field Effect Transistor (MOSFET) technology offers higher gain and lower capacitance per unit area than Junction Field Effect Transistor (JFET) technology. Hearing aid microphones have traditionally used JFET front ends to achieve low noise. However, the push to smaller sizes makes the use of MOSFETs attractive. Specifically, the prior art used enhancement mode MOSFETs, Complimentary MOS transistors (CMOS), and/or other types of enhancement mode devices at the front end of the amplifier portion or after the microphone portion of these hearing aids. (For example, see Murphy et al. U.S. Pat. No. 4,764,690). At the very least, this is done to reduce the overall size of the hearing aid device and to additionally reduce power consumption when CMOS technology is used.

However, problems arise when enhancement mode devices are used at the front end of the amplifier portion of a hearing aid device. Specifically, when a voltage is applied to turn on (or enhance) an enhancement mode device, carriers from the source to the drain of the device are conducted along the surface wherein the surface is the physical separation between the two dissimilar materials of silicon and silicon dioxide. As the carriers are conducted along the surface, trapping and releasing of carriers occur based on the vertical field between the gate and the channel, as is commonly known in the art. Therefore, there is always some component of electrical field pulling the carriers toward the surface, causing trapping and releasing at the surface. This trapping and releasing results in an approximately 1/f noise; f being the frequency of the noise.

At higher frequencies, one gets lower relative noise. However, at lower frequencies, frequencies commonly requiring the assistance of a hearing aid device, a relatively large amount of noise is produced from the trapping and releasing due to the conduction of carriers in the conduction channel of the enhancement mode transistor. The commonly known method of reducing the previously mentioned noise incorporates making the size of the enhancement mode devices very large so that the noise is integrated out by the increased area of the transistors. However, making large devices within the circuitry is contrary to the basic goal of creating smaller hearing aid devices.

Hence, when a signal is produced by a microphone, the impedance of the microphone must be matched or buffered to the transmission medium which receives the signal. Generally, as previously mentioned, in the case of a hearing aid, the microphone portion impedance must be appropriately buffered to the amplifier portion impedance in order for efficient amplification to occur.

Thus, it is an object of the present invention to provide a circuit to match the impedance of the microphone portion and the amplifier portion of a hearing aid. This object is accomplished while, at the same time, solving the noise, size, and other problems of the prior art. This invention, while solving these problems of the prior art, also maintains the same or higher level of performance as the prior art.

SUMMARY OF THE INVENTION

The present invention is an impedance matching, reduction, or buffer circuit that permits smooth signal flow from a first transmission medium to a second transmission medium. The impedance circuit includes a first node that is adapted for coupling to the first transmission medium. The first node receives a signal from the first transmission medium. The impedance circuit also includes a buried channel transistor that is coupled to the first node and is used for transforming the impedance imposed on the signal. The impedance circuit further includes a second node that is coupled to the buried channel transistor and is adapted for coupling to the second transmission medium. The second node is the point at which the signal is conveyed to the second transmission medium.

In one embodiment of the invention, the impedance circuit further includes a biasing portion that is coupled to the buried channel transistor, the first node, and the second node. The biasing portion comprises a configuration that is responsive to the buried channel transistor, and is responsive to the signal when the signal is in a transient state. The impedance circuit further includes a resistor that is coupled to the biasing portion, and is coupled to the buried channel transistor. The resistor is used for creating a bias current for the buried channel transistor.

In operation, when a voltage source is applied, to the buried channel transistor, instead of trapping and releasing occurring along the surface of the transistor, the conduction occurs beneath the surface. Since the conduction occurs beneath the surface, a significantly less amount of noise is created, and impedance matching can take place without noise significantly affecting the signal. In further operation, the buried channel transistor creates a high impedance at the first node, and creates a low impedance at the second node based on the buried channel transistor's inherent structure. Thus, the impedance is reduced and excessive noise is not produced while the other standards of performance are kept at a high level.

For a better understanding of the invention, reference may be had to the following specification taken in conjunction with the following drawing. Furthermore, other features and advantages of the invention will be apparent from the following specification taken in conjunction with the following drawing.

BRIEF DESCRIPTION OF THE DRAWINGS

FIG. 1 is a schematic drawing of one embodiment of the full impedance circuit.

DETAILED DESCRIPTION

While this invention is susceptible of embodiments in many different forms, there is shown in the drawings and will herein be described in detail, a preferred embodiment of the invention with the understanding that the present disclosure is to be considered as an exemplification of the principles of the invention and is not intended to limit the broad aspects of the invention to the embodiment illustrated.

FIG. 1 shows an impedance circuit for reducing/buffering the impedance between a first transmission medium and a second medium. In a hearing aid, the first transmission medium can, at least, represent a microphone portion (not shown) and/or the medium of transmission which the microphone portion creates in operation. Further in a hearing aid, the second transmission medium can, at least, represent the amplifier portion (not shown) and/or the medium of transmission which the amplifier portion requires for satisfactory operation. When the impedance circuit is in use, VIN is the signal that is received from the first transmission medium of the hearing aid, and VOUT is the signal that is conveyed along to the second transmission medium.

FIG. 1 further shows a first transistor 20 that is used in conjunction with a second transistor 30 for biasing a third transistor 40. The first and second transistors 20, 30 together, generally, make up what can be referenced as a biasing portion 70. The biasing portion 70 can alternatively comprise devices that are used to bias transistors generally, as is well known. Such biasing devices can include very large resistors, typically in the giga-ohm range, or diodes. However, FIG. 1 includes one embodiment in which the first and second transistors 20, 30 are Bi-Polar-Junction Transistors (BJTs). Although BJTs are used in FIG. 1, MOSFETs or other types of transistors can also be used to bias the third transistor 40. In summary, the requirement is to establish a DC bias point while maintaining very high input impedance.

Continuing, within the impedance circuit generally disclosed in FIG. 1, the first transistor 20 includes one emitter terminal 22, one base terminal 26, and one collector terminal 24. In addition, the second transistor 30 includes one emitter terminal 32, one base terminal 36, and one collector terminal 34.

The third transistor or buried channel transistor 40 in FIG. 1 is a conventional device, such as a depletion mode n-channel transistor, which is fabricated so that a depletion region exists above the channel as can be achieved by one of ordinary skill in the art. This type of fabrication minimizes trapping and releasing at the surface. Thus, noise created through trapping and releasing does not occur at the surface when the third transistor is in operation.

The third transistor 40 can be an n-type depletion mode MOSFET. In the preferred form of the third transistor 40, the width equals one hundred 100 microns and the length equals three 3 microns.

Hence, in one form of the impedance circuit in FIG. 1, the third transistor 40 includes at least one drain terminal 44, at least one backside terminal 48, at least one source terminal 42, and at least one gate terminal 46. The drain terminal 44 of the third transistor 40 is coupled to a voltage source 60. A first node (A) couples the emitter terminal 22 of the first transistor 20 to the gate terminal 46 of the third transistor 40. The first node (A) also couples the emitter terminal 22 of the first transistor 20 and the gate terminal 46 of the third transistor to the first transmission medium. The first node (A) further couples the base terminal 36 to the emitter 22 of the first transistor 20 and the gate 46 of the third transistor 40.

Additionally, in the embodiment in FIG. 1, a second node (B) couples the collector terminal 24 of the first transistor 20 to the collector terminal 34 of the second transistor 30. The second node (B) also couples the source terminal 42 and the backside terminal 48 of the third transistor 40 together. The second node (B) additionally couples the two respective collector terminals 24, 34 of the first and second transistors 20, 30 to the source and backside terminals 42, 48 of the third transistor 40. Furthermore, the second node (B) couples the two collector terminals 24, 34 of the first and second transistors 20, 30, and the source and backside terminals 42, 48 of the third transistor 40 to the second transmission medium.

The impedance circuit in FIG. 1 further includes a resistor 50 which, in conjunction with the first and second transistors 20, 30, creates an appropriate bias current for the third transistor 40. The second node (B) couples a first end 52 of the resistor 50 to the respective second node (B) coupled terminals 24, 34, 42, and 48, and to the second transmission medium. The second end 54 of the resistor 50 is coupled to ground 14. The value of the resistor 50 can be 22K ohms in one embodiment of the invention.

As an alternative, resistor 50 can be replaced by a current source. Further, in the impedance circuit in FIG. 1, the base terminal 26 of the first transistor 20 is coupled to ground 14. In addition, first and second transistors 20 and 30 function as diodes to establish the DC bias of node A. It should be appreciated that each of the transistors may have more than one terminal of the same type.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A circuit for permitting smooth signal flow from a first transmission medium to a second transmission medium comprising:
- means adapted for coupling to the first transmission medium for receiving a signal;
- means coupled to the receiving means for transforming the impedance imposed on the signal comprising a buried channel transistor;
- means coupled to the transforming means and adapted for coupling to the second transmission medium for conveying the signal to the second transmission medium; and,
- means coupled to the transforming means for biasing the transforming means, the biasing means comprising two BJT transistors, each BJT transistor having a collector terminal, wherein the collector terminal of one BJT transistor is connected to the collector terminal of the other BJT transistor.

2. The circuit as claimed in claim 1 further comprising means, coupled to the biasing means and the transforming means, for creating a bias as current for the transforming means.

3. The circuit as claimed in claim 1, wherein the transforming means comprises a MOSFET of the depletion mode type.

4. The signal transformation circuit as claimed in claim 2, wherein the means for creating a bias current for the transforming means is a resistor of an appropriate value.

5. An amplifier buffer circuit for transforming a signal generated by a first transmission medium so that a second transmission medium can further manipulate the signal in a miniature hearing aid comprising:
- means for receiving the signal generated by the first transmission medium;
- a depletion mode transistor having a buried channel which prevents trapping from occurring on the surface of the depletion mode transistor and which reduces noise in the operation of the depletion mode transistor device, the depletion mode transistor being coupled to the receiving means, the depletion mode transistor reducing the impedance between the first transmission medium and the second transmission medium;
- means coupled to the depletion mode transistor for conveying the signal along to the second transmission medium; and,
- means coupled to the depletion mode transistor for biasing the depletion mode transistor, the biasing means comprising two BJT transistors, each BJT transistor having a collector terminal, wherein the collector terminal of one BJT transistor is connected to the collector terminal of the other BJT transistor.

6. The amplifier buffer circuit as claimed in claim 5 further comprising means, coupled to the biasing means and coupled to the depletion mode transistor, for creating a bias current for the depletion mode transistor.

7. The signal transformation circuit as claimed in claim 6, wherein the means for creating a bias current for the depletion mode transistor is a resistor of an appropriate value.

8. The amplifier buffer circuit as claimed in claim 5, wherein the depletion mode transistor is of the MOSFET type.

9. A circuit for reducing the impedance between a first transmission medium and a second medium comprising:
- a first transistor having at least one emitter, one base, and one collector terminal;
- a second transistor having a least one emitter, one base, and one collector terminal;
- a third transistor having a buried channel, and having at least one drain, one backside, one source, and one gate terminal;
- a first coupling means for coupling the collector terminal of the first transistor to the collector terminal of the second transistor, and for coupling the collector terminals of the first and second transistors to the source terminal of the third transistor, and;
- a second coupling means for coupling the emitter terminal of the first transistor to the gate terminal of the third transistor.

10. The circuit as claimed in claim 9, further comprising means, coupled between ground and the first coupling means, for creating a bias current for the third transistor.

11. The circuit as claimed in claim 9, wherein the base terminal of the first transistor is coupled to ground.

12. The circuit as claimed in claim 9, wherein the drain terminal of the third transistor is coupled to a voltage source.

13. The circuit as claimed in claim 9, wherein the third transistor is a MOSFET the depletion mode type.

14. The circuit as claimed in claim 9, wherein the second coupling means is also a means for coupling the emitter terminal of the first transistor and the gate terminal of the third transistor to the first transmission medium.

15. The circuit as claimed in claim 9, wherein the first coupling means is also a means for coupling the collector terminal of the first transistor, the collector terminal of the second transistor, and the source terminal of the third transistor to the second transition medium.

16. The circuit as claimed in claim 9, wherein the first coupling means is also a means for coupling the collector terminal of the first transistor, the collector terminal of the second transistor, and the source terminal of the third transistor to the backside terminal of the third resistor.

* * * * *

UNITED STATES PATENT AND TRADEMARK OFFICE
CERTIFICATE OF CORRECTION

PATENT NO. : 5,446,413
DATED : August 29, 1995
INVENTOR(S) : Peter V. Loeppert and Steven E. Boor It is certified that error appears in the above-indentified patent and that said Letters Patent is hereby corrected as shown below:

At claim 13, column 6, line 39, please add the word "of" between the words "MOSFET" and "the."

At claim 15, column 6, line 49, please replace the word "transition" with the word "transmission."

At claim 16, column 6, line 55, please replace the word "resistor" with the word "transistor."

Signed and Sealed this

Sixteenth Day of July, 1996

Attest:

BRUCE LEHMAN

*Attesting Officer*  *Commissioner of Patents and Trademarks*